United States Patent
Avinash

(10) Patent No.: US 7,359,540 B2
(45) Date of Patent: Apr. 15, 2008

(54) SYSTEMS AND METHODS FOR CORRECTING INHOMOGENEITY IN IMAGES

(75) Inventor: Gopal B. Avinash, New Berlin, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 752 days.

(21) Appl. No.: 10/608,236

(22) Filed: Jun. 27, 2003

(65) Prior Publication Data

US 2004/0264751 A1    Dec. 30, 2004

(51) Int. Cl.
*G06K 9/00* (2006.01)

(52) U.S. Cl. ............... 382/131; 382/128; 382/254; 324/307; 324/320; 600/410

(58) Field of Classification Search ........ 382/128–134, 382/254; 600/407, 409, 410, 425, 473, 474, 600/475, 476, 411, 412, 477, 524; 128/899; 324/300, 307, 309, 312, 324, 320
See application file for complete search history.

(56) References Cited

U.S. PATENT DOCUMENTS

| | | | |
|---|---|---|---|
| 5,113,865 A * | 5/1992 | Maeda et al. ............... 600/410 |
| 5,137,355 A | 8/1992 | Barbour et al. | |
| 5,627,469 A | 5/1997 | Hong et al. | |
| 5,627,907 A * | 5/1997 | Gur et al. ................... 382/132 |
| 5,694,938 A | 12/1997 | Feng et al. | |
| 5,699,153 A | 12/1997 | Takamoto et al. | |
| 5,746,210 A | 5/1998 | Benaron et al. | |
| 5,752,519 A * | 5/1998 | Benaron et al. ............ 600/476 |
| 5,987,346 A | 11/1999 | Benaron et al. | |
| 6,081,322 A | 6/2000 | Barbour | |
| 6,263,228 B1 * | 7/2001 | Zhang et al. ............... 600/409 |
| 6,275,038 B1 * | 8/2001 | Harvey ...................... 324/309 |
| 6,327,489 B1 | 12/2001 | Hoogenraad et al. | |
| 6,377,041 B1 | 4/2002 | Jones, Jr. et al. | |
| 6,445,182 B1 * | 9/2002 | Dean et al. ................. 324/309 |

* cited by examiner

*Primary Examiner*—Abolfazl Tabatabai
(74) *Attorney, Agent, or Firm*—Armstrong Teasdale LLP

(57) ABSTRACT

A method for generating an estimate of inhomogeneity includes generating a first estimate of inhomogeneity, generating a second estimate of inhomogeneity, and generating a final estimate of inhomogeneity using at least the first and second estimates.

28 Claims, 3 Drawing Sheets

SYSTEMS AND METHODS FOR CORRECTING INHOMOGENEITY IN IMAGES

BACKGROUND OF THE INVENTION

The invention disclosed and claimed herein is generally directed to a method for correcting spatial inhomogeneity or nonuniformity of spatial intensity in an acquired magnetic resonance (MR) or other medical diagnostic image. More particularly, the invention is directed to a correction method of such type wherein the primary component of inhomogeneity is slowly varying.

In many areas of imaging including MR and computed tomography (CT), acquired images are corrupted by slowly varying multiplicative inhomogeneities or nonuniformities in spatial intensity. Such nonuniformities can hinder visualization of the entire image at a given time, and can also hinder automated image analysis. Such inhomogeneity is a particular concern in MR when single or multiple surface coils are used to acquire imaging data. The acquired images generally contain intensity variations resulting from the inhomogeneous sensitivity profiles of the surface coil or coils. In general, tissue next to the surface coil appears much brighter than tissue far from the coil. Spatial intensity variations introduced by surface coil nonuniformity hinders visualization because one cannot find a window/level adjustment to encompass the entire field of view. When such images are filmed, the operator tries to select a setting which covers most of the features of interest. Furthermore, uncorrected image inhomogeneity makes it difficult to perform image segmentation and other aspects of image analysis.

An example of the problem is spine imaging, wherein one or more surface coils are placed behind a patient. If the central spinal canal is filmed optimally, tissue structure behind the vertebral column may be overamplified and may become so bright that no tissue detail can be seen. At the same time, tissue in front of the vertebral column may be so dark that image detail in that area is also obscured. Therefore, in order to optimally display and film the entire image, the signal variation due to the inhomogeneous sensitivity profile of the surface coil needs to be corrected. Surface coil image signal intensities generally represent the product of (1) precessing magnetization of the body tissue or other object being imaged, and (2) the sensitivity profile of the surface coil. Accordingly, various intensity correction algorithms have been devised to correct surface coil images by dividing out an estimate of the surface coil's sensitivity profile. Thus, if the observed or acquired MR image signal is defined in a spatial domain for a pixel location (x,y) by a function g(x,y) then g(x,y)=h(x,y)*f(x,y)+n(x,y), where * represents multiplication, h function., f function and n represent the coil profile function, a corrected function, and the imaging noise, respectively. More specifically, the corrected function is a function defining an image which is substantially free of distortion resulting from the inhomogeneity. Thus, the problem is to determine both h and f, given only the measured or acquired function g in the presence of n. However, if the function h can be determined which reasonably represents the inhomogeneity distortion, then the function f can be readily computed from f=[g*h]/[h*h+$\psi_1$], which is known in the art as Weiner filter solution, where $\psi_1$ is a regularization parameter corresponding to the reciprocal of signal to noise ratio.

The distortion arising from use of surface coils generally varies slowly over space. An important class of prior art solutions to the above problem is based on this assumption. In accordance therewith, a low pass filtering operation is applied to g. The resulting function, represented as LPF[g], does not contain high frequency components and is taken as an estimate of distortion function h. An estimate of the function f is then obtained by dividing g by LPF[g], i.e., f=g/LPF[g]. However, for this class of methods to be effective, g must not contain sharp intensity transitions. Unfortunately, in MR imaging an air-lipid interface usually contains sharp intensity transitions which violate the basic assumption made in the method, i.e., that the low frequency content in the scene being imaged is solely due to h. Significant air-lipid interferences will generally be encountered, for example, at the edges of an organ, i.e., at the boundary between the organ and an air-space or cavity.

To overcome the above deficiency in low pass filtering correction at the edge or boundary of an organ or other tissue structure, certain hybrid filtering techniques have been developed. Some of such techniques are set forth in the following references: Surface Coil MR Imaging of the Human Brain with an Analytic Reception Profile Correction, JMRI 5, 139-144, by S. E. Moyher, D. B. Vigeron, and S. J. Nelson; Phased Array Detectors and an Automated Intensity Correction Algorithm for High Resolution MR Imaging of the Human Brain, JMRI (1995), by L L. Wald, L. Carvajal, S. E. Moyher, S. J. Nelson, P. E. Grant, A. J. Barkovich, and D. B. Vingeron; Phased Array Image Intensity Correction: An Algorithm to Remove Intensity Variations in MR Images Resulting from the Inhomogeneous Sensitivity Profiles of Phased Array Surface Coils, a Master's thesis by J. Murakami (1995), University of Washington, Seattle, and in U.S. Pat. No. 5,943,433.

Intensity inhomogeneities can influence visualization of digital images. If there are multiple kinds of inhomogeneities in a digital image, several difficulties arise while compensating for such inhomogeneities. As an illustration, if there are two different kinds of inhomogeneities in a digital image, a designed algorithm may not be able to properly multiple inhomogeneities since the algorithm is tuned to mitigate one kind of inhomogeneity. Inadequate compensation can result in unsatisfactory visual appearance of the compensated image. If any specific scale is used for intensity correction, it is inadequate due to the reasons stated above. On the other hand, if an entire image is used for the intensity correction, it results in a flat image without any contrast. Moreover, if a normalization based on average intensity is performed on digital images, inconsistent results can occur between different slices of the digital images.

BRIEF DESCRIPTION OF THE INVENTION

In one aspect a method for generating an estimate of inhomogeneity is provided. The method includes generating a first estimate of inhomogeneity, generating a second estimate of inhomogeneity, and generating a final estimate of inhomogeneity using at least the first and second estimates.

In another aspect, a magnetic resonance imaging (MRI) system includes a main magnet configured to generate a substantially uniform magnetic field, a radio frequency pulse generator configured to excite the magnetic field, a gradient field generator configured to generate gradients extending in different directions in the magnetic field, a receiver configured to receive magnetic field magnetic resonance (MR) signals representative of an object, and a computer operationally coupled to the receiver. The computer is configured to generate a first estimate of inhomogeneity, generate a second estimate of inhomogeneity, and generate a final estimate of inhomogeneity using at least the first and second estimates.

In another aspect, a computer readable medium is encoded with a program configured to instruct a computer to generate a first estimate of inhomogeneity, generate a second estimate of inhomogeneity, and generate a final estimate of inhomogeneity using at least the first and second estimates.

DETAILED DESCRIPTION OF THE INVENTION

The herein described systems and methods provide equalization in images having more than one kind of inhomogeneities. A final homogeneity estimate or digital values $h(x,y)$ incorporate a combination of a specific level of smoothness and an entire level of smoothness. For instance, a first inhomogeneity estimate $h_1(x,y)$ and a second inhomogeneity estimate $h_2(x,y)$ are combined into the final inhomogeneity estimate h. This combination can be accomplished using a suitable blending of the specific scale image and an acquired image $I_a$. Moreover, the herein described systems and methods provide improvements in the normalization to compensate for potential variations in intensities of digital images. Additionally the herein described systems and methods automatically determine a threshold for compensating smoothing of strong image features such as those appearing at tissue-air interfaces.

Figure 1:
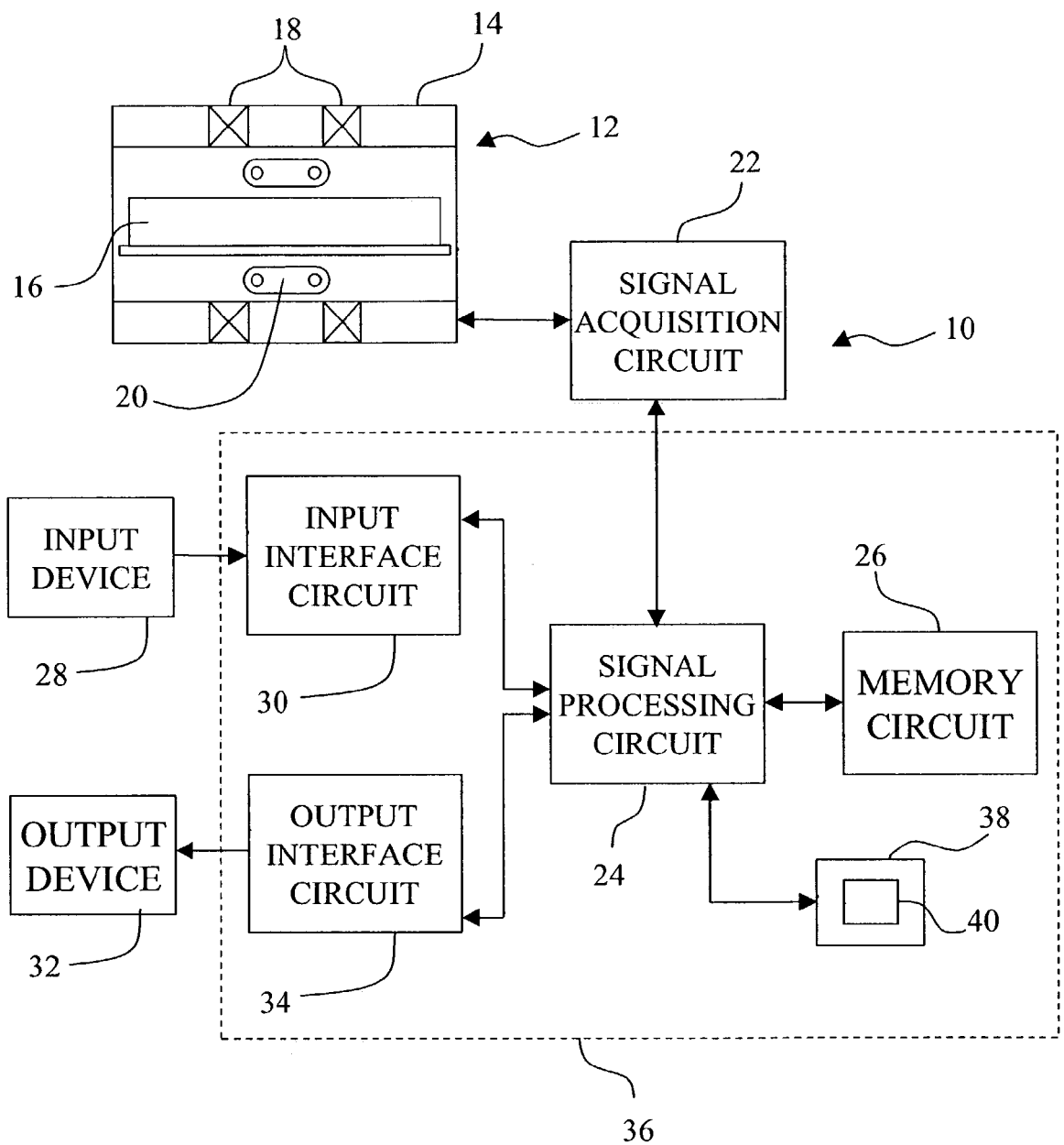
FIG. 1 is a simplified block diagram of a magnetic resonance imaging (MRI) system which incorporates systems and methods for correcting inhomogeneity in images.

FIG. 1 is a simplified block diagram of a magnetic resonance imaging (MRI) system 10 which incorporates systems and methods for correcting inhomogeneity in images. MRI system 10 is illustrated as including a scanner 12 coupled to circuitry for acquiring and processing discrete pixel data. Scanner 12 includes a support structure 14 in which a physical subject 16, such as a human being, may be placed for acquiring images representative of internal features, such as tissues, fluids and so forth. Scanner 12 includes an electromagnet arrangement 18 for producing an electromagnetic field. Excitation and sensing coils 20 are provided within scanner 12 for exciting gyromagnetic materials within subject 16 and for sensing emissions from the materials.

Signals sensed by coils 20 are encoded to provide digital values representative of the excitation signals emitted at specific locations within the subject, and are transmitted to signal acquisition circuitry 22. Signal acquisition circuitry 22 also provides control signals for configuration and coordination of fields emitted by coils 20 during specific image acquisition sequences. Signal acquisition circuitry 22 transmits the encoded image signals to a signal processing circuit 24. Signal processing circuit 24 executes pre-established control logic routines stored within a memory circuit 26 to filter and condition the signals received from signal acquisition circuitry 22 to provide 50 (see FIG. 2) digital values $g_a(x,y)$, such as, for instance, intensity values, representative of each pixel at location (x,y) in the acquired image $I_a$. The digital values $g_a(x,y)$ are then stored in memory circuit 26.

Signal processing circuitry 22 executes the methods for correcting inhomogeneity in the acquired image $I_a$ by using the digital values $g_a(x,y)$. Although $I_a$ refers to an entire image, and $g_a(x,y)$ refers to a particular pixel, $I_a$ and $g_a(x,y)$ are sometimes used interchangeably herein. Additionally, to ease readability, $g_a$ is also used to represent $g_a(x,y)$. This convention is also maintained in reference to other images and respective pixel values herein.

Signal processing circuit 24 receives configuration and control commands from an input device 28 via an input interface circuit 30. Input device 28 will typically include an operator's station and keyboard for selectively inputting configuration parameters and for commanding specific image acquisition sequences. Signal processing circuit 24 is also coupled to an output device 32 via an output interface circuit 34. Output device 32 will typically include a monitor or printer for generating reconstituted images based upon the image enhancement processing carried out by signal processing circuit 24.

It is noted that, while in the present discussion reference is made to discrete pixel images generated by an MRI system, the systems and methods described herein are not limited to any particular imaging modality. Accordingly, the systems and methods may also be applied to image data acquired by X-ray systems, digital radiography systems, positron emission tomography (PET) systems, and computed tomography (CT) systems, among others. It should also be noted that in the embodiment described, signal processing circuit 24, memory circuit 26, and input and output interface circuits 30 and 34 are included in a programmed digital computer 36. However, circuitry for carrying out the techniques described herein may be configured as appropriate coding in application-specific microprocessors, analog circuitry, or a combination of digital and analog circuitry. Computer 36 includes a device 38, for example, a floppy disk drive, CD-ROM drive, DVD drive, magnetic optical disk (MOD) device, or any other digital device including a network connecting device such as an Ethernet device for reading instructions and/or data from a computer-readable medium 40, such as a floppy disk, a CD-ROM and a DVD, as well as yet to be developed digital means. In another embodiment, computer 36 executes instructions stored in firmware (not shown). Computer 36 is programmed to perform functions described herein, and as used herein, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein.

Figure 2:
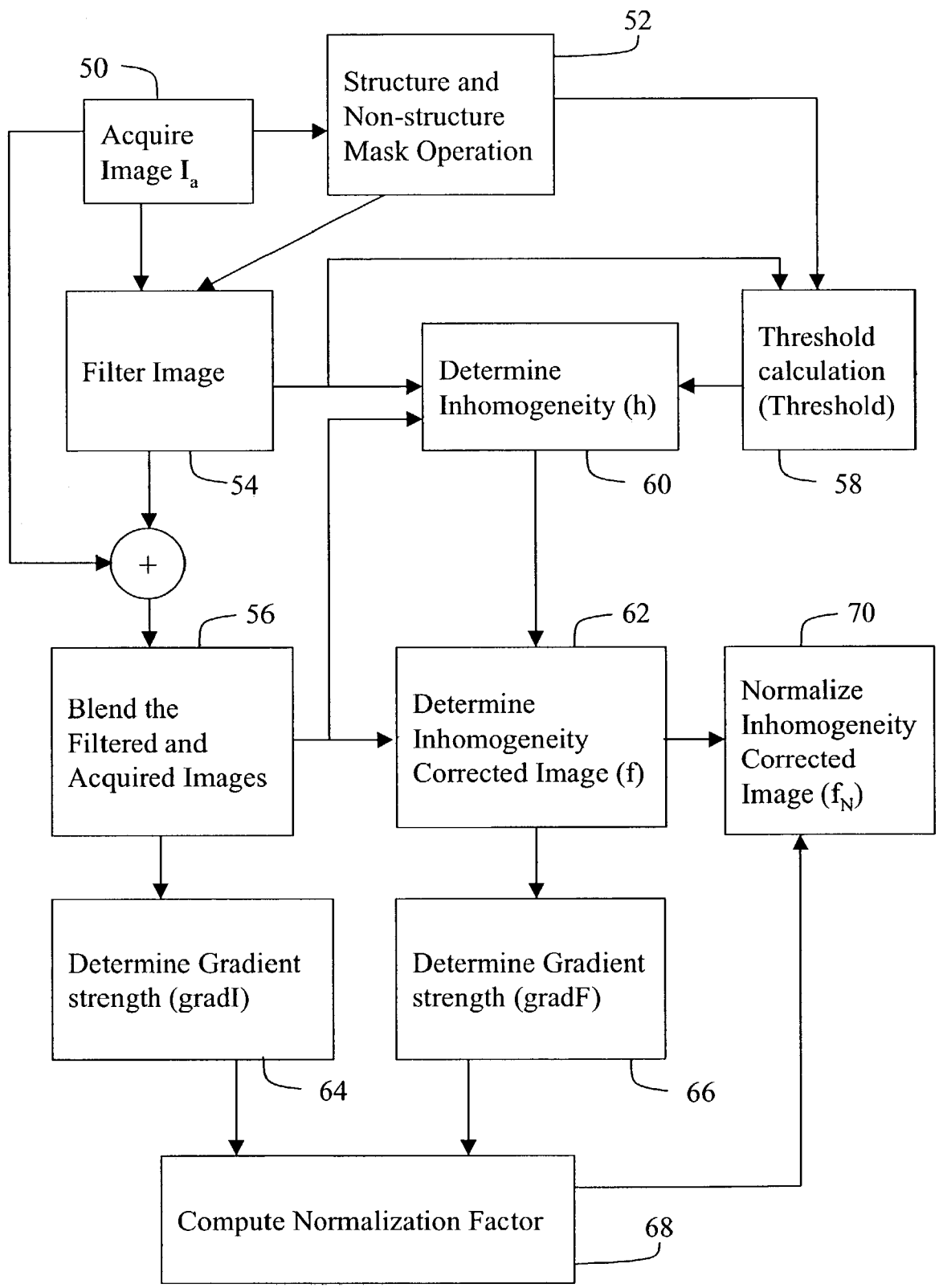
FIG. 2 is a flowchart of an embodiment of a method for correcting inhomogeneity in images.

FIG. 2 is a flowchart of an embodiment of a method for correcting inhomogeneity in images. The method includes distinguishing between structure and non-structure in the acquired image $I_a$ by performing 52 a mask operation. The mask operation produces a mask image $I_{mask}$ having digital values $g_{mask}(x,y)$. In the mask operation, digital value of a pixel is set to 1 if the corresponding pixel (x,y) in image $I_a$ is structure and is set to 0 if the corresponding pixel (x,y). in image $I_a$ is non-structure.

The method distinguishes structure from non-structure as follows. A normalized image $I_{norm}$ is formed from the acquired image $I_a$. The acquired image $I_a$ is normalized by reading the digital values $g_a(x,y)$ and scaling the values over a desired dynamic range. A gradient image $I_{grad}$ is computed from a blurred or smoothed version of the normalized image $I_{norm}$. An example of a smoothing operation includes boxcar smoothing. In boxcar smoothing, a boxcar filter smoothes the normalized image $I_{norm}$ by computing the average of a given neighborhood. The kernel is separable and its length, such as, for instance, 3 pixels, is variable. The kernel is moved horizontally and vertically along the normalized image $I_{norm}$ until each pixel of the image has been processed. The smoothing operation results in an image $I_s$ having digital values $g_s(x,y)$.

For example, at every pixel of the image $I_s$, computed are an X gradient component, a Y gradient component, and a resultant gradient as the maximum of the two components. If desired, the direction of the gradient using arctan(Y gradient component/X gradient component) can be computed. While several techniques may be employed for this purpose, in one embodiment, 3×3 Sobel modules or operators are employed. One module is used for identifying the X gradient component, while another module is used for identifying the Y gradient component of each pixel of the image $I_s$. In this process, the modules are superimposed over an individual pixel of interest in the image $I_s$, with the pixel of interest situated at the central position of the 3×3 module. The digital values $g_s(x,y)$ located at element locations within each module are multiplied by the scalar value contained in the corresponding element, and the resulting values are summed to arrive at the corresponding X and Y gradient components.

With these gradient components thus computed, the gradient magnitude $G_{mag}$ and gradient direction $G_{dir}$ are computed. The gradient magnitude $G_{mag}$ for each pixel is equal to the higher of the absolute values of the X and Y gradient components for the respective pixel. The gradient direction is determined by finding the arctangent of the Y gradient component divided by the X gradient component. For pixels having an X gradient component equal to zero, the gradient direction is assigned a value of $\pi/2$. The values of the gradient magnitudes $G_{mag}$ and gradient directions $G_{dir}$ for each pixel are saved in memory circuit 26.

It should be noted that alternative techniques may be employed for identifying the X and Y gradient components and for computing the gradient magnitudes and directions. For example, in place of Sobel gradient modules, other modules such as the Roberts or Prewitt operators are employed. Moreover, the gradient magnitude $G_{mag}$ may be assigned in other manners, such as a value equal to the sum of the absolute values of the X and Y gradient components or a value equal to a square root of a sum of squares of the X and Y gradient components.

A gradient histogram is created specifically based upon the gradient magnitudes $G_{mag}$. The gradient histogram is a bar plot of specific populations of pixels having specific gradient magnitudes $G_{mag}$. These gradient magnitudes $G_{mag}$ are indicated by positions along a horizontal axis, while counts of the pixel populations for each gradient magnitude $G_{mag}$ are indicated along a vertical axis, with each count falling at a discrete level. The resulting bar graph forms a step-wise gradient distribution curve. It is noted that in an actual implementation, the gradient histogram need not be represented graphically, but may be functionally determined by signal processing circuit 24 operating in cooperation with values stored in memory circuit 26.

The gradient histogram is used to identify an initial gradient threshold (IGT) for separating structure from non-structure. The IGT is set at a desired gradient magnitude level $G_{mag}$. Pixels having gradient magnitudes $G_{mag}$ at or above the IGT are considered to meet a first criterion for defining structure, while pixels having gradient magnitudes $G_{mag}$ lower than the IGT are initially considered non-structure. The IGT used to separate structure from non-structure is set by an automatic processing or "autofocus" routine. However, alternatively, IGT is set by operator intervention, via input interface circuit 30 or a value identified through the automatic process described above may be overridden by the operator.

The process for identification of the IGT is as follows. The IGT is conveniently set to a value corresponding to a percentile of the pixel population, such as $30^{th}$ percentile. The location of the IGT along the horizontal axis is thus determined by adding pixel population counts from the left-hand edge of the gradient histogram, adjacent to the vertical axis and moving toward the right. Once a desired percentile value is reached, the corresponding gradient magnitude $G_{mag}$ is the value assigned to the IGT. It is noted that in an alternative embodiment, the smoothing and the normalization operations that are described above are not performed.

The mask image $I_{mask}$ is isotropically smoothed in the non-structure region of the image and anisotropically smoothed in the structure region of the image to obtain 54 a filtered image $I_f$ with digital values $g_o(x,y)$. Boxcar smoothing, which is an example of isotropic smoothing, is described above. In anisotropic smoothing, the structure region is filtered to extract domain orientation information. Anisotropic smoothing involves iteratively filtering the structure by a smoothing kernel, such as a 3×1 smoothing kernel, along a dominant direction in a given neighborhood of the image $I_{mask}$, which would be the direction of majority of the local minimum variances in that neighborhood. The iterations are performed a set number of times, such as, for instance, 3 times.

Each iteration is accomplished using the following steps. The structure region is scanned and a local orientation map is obtained by assigning one of four orientation numbers, for instance, assigning 1 for 45 degrees, 2 for 135 degrees, 3 for 90 degrees, and 4 for 0 degrees. The structure region is scanned again and the dominant orientation at any point is determined by counting the number of different orientations in a neighborhood of the image $I_{mask}$. An orientation getting the maximum counts is the dominant orientation.

As a further refinement, both the dominant orientation and its orthogonal orientation are used to make a consistency decision. The consistency decision is made if one of the following conditions is met: (1) An orientation getting maximum counts is greater than a pre-specified percentage, for instance, 0.67 percent, of the total counts in a neighborhood of the image $I_{mask}$ and its orthogonal orientation gets the minimum counts, (2) An orientation getting maximum counts is greater than a smaller percentage, for example, 0.44 percent, of the total counts in a neighborhood of the image $I_{mask}$, its orthogonal orientation gets the minimum count, and the ratio of the dominant count and its orthogonal count is greater than a pre-specified number, for example, 5, and (3) The ratio of a dominant count to its orthogonal count is greater than 10. Smoothing is performed along a dominant orientation.

The acquired image $I_a$ and the filtered image $I_f$ are blended 56 using different parameters corresponding to the structure and the non-structure regions to obtain a blended image $I_b$ with digital values $g(x,y)$. As an example, the acquired image $I_a$ and the filtered image $I_f$ are blended using an equation:

$$g(x,y)=\alpha(g_o(x,y)-g_a(x,y))+g_a(x,y), \text{ if } g_{mask}(x,y)=0$$

$$\text{else } g(x,y)=\beta(g_o(x,y)-g_a(x,y))+g_a(x,y), \text{ if } g_{mask}(x,y)=1, \qquad (1)$$

where α is an operator selected parameter such that $0<\alpha<1$, and where β is an operator selected parameter such that $0<\beta<1$.

The method for correcting inhomogeneity in images further includes calculating 58 a threshold value T from the digital values $g_o(x,y)$ of the filtered image $I_f$. Alternatively, the threshold value T is calculated directly from the mask image $I_{mask}$. From the filtered image $I_f$, a foreground intensity (FI) is computed as an average of the structure regions and a background intensity (BI) is computed as an average of the non-structure regions having intensity less than FI. From the non-structure regions with intensities less than FI, a standard deviation (SD) is also calculated. The threshold value T is obtained from FI, BI, and SD. As an example, If (SD/BI)<0.2, T = FI * (BI/FI +0.2);
Else if (SD/BI)<0.5, T = FI * (BI/FI +0.1);
Else if (SD/BI)≦1.0, T = BI;
Else if ((SD/BI)>1.0) AND (BI/FI)<0.2, T = FI * 0.2;
Else {
 T = FI*(BI/FI−0.1);
 If T<0.0, T=FI * 0.1;
} (2)

It is noted that the values 0.1, 0.2, and 0.5 in equation (2) are exemplary and that any value between 0 and 1 can be used instead.

The method includes determining 60 an inhomogeneity image $I_{inhomogeneity}$ having digital values $h(x,y)$ from the digital values $g(x,y)$ of the blended image $I_b$. The inhomogeneity image $I_{inhomogencity}$ corrupts a desired image $I_{desired}$ having digital values $f(x,y)$. The relationship between the digital values $h(x,y)$, $g(x,y)$, $f(x,y)$, and additive noise n is provided by $$g=hf+n \quad (3)$$

The inhomogeneity image $I_{inhomogeneity}$ is obtained as follows. The digital values $g(x,y)$ are shrunk by a factor equal to or greater than 1. As an example, the shrink function uses average digital values in non-overlapping integer neighborhoods of a particular size, such as, 3×3, to create a shrunk image $I_{shrunk}$ with digital values $g_{shrunk}(x,y)$. It is noted that other types of shrink functions can be used. A thresholding function is performed on the digital values $g_{shrunk}(x,y)$ based on the threshold value T. For example, if the digital value $g_{shrunk}(x,y)$ is greater than the threshold value T, $g_{shrunk}(x,y)$ is set to 1 and if $g_{shrunk}(x,y)$ is less than T, $g_{shrunk}(x,y)$ is assigned a value of 0. The thresholding function results in digital values $Threshold(g_{shrunk}(x,y))$. The digital values $g_{shrunk}(x,y)$ and $Threshold(g_{shrunk}(x,y))$ are filtered by using, for example, a low pass filter (LPF), to provide digital values, $LPF(g_{shrunk}(x,y))$ and $LPF[Threshold(g_{shrunk}(x,y))]$ respectively. LPF removes higher frequency components associated with sharp intensity transitions. LPF commences by taking a transform, such as a fast Fourier transform (FFT) or a Discrete Cosine Transform (DCT), of $g_{shrunk}(x,y)$ and $Threshold(g_{shrunk}(x,y))$. Respective transform components are then multiplied by coefficients predetermined in accordance with a filter operation, such as a Gaussian filter operation. Inverse functions, such as an inverse FFT, are then computed for respective coefficient multiplication's, to determine $LPF(g_{shrunk}(x,y))$ and $LPF[Threshold(g_{shrunk}(x,y))]$.

Digital values $h_s(x,y)$ are obtained as follows.

$$h_s(x,y)=LPF(g_{shrunk}(x,y))/LPF[Threshold(g_{shrunk}(x,y))] \quad (4)$$

First inhomogeneity estimates or digital values $h_1(x,y)$ are obtained from the digital values $h_s(x,y)$ by expanding $h_s(x,y)$. The digital values $h_s(x,y)$ are expanded by implementing a process such as bilinear interpolation and for 3-dimensional digital values, trilinear interpolation is used to expand the 3-dimensional digital values. Such a process is described, for example, in Numerical Recipes in C, The Art of Scientific Computing, by William H. Press, Brian P. Flannery, Saul A. Tenkolsy, and William T. Vetterling; Cambridge University Press (1988).

Second inhomogeneity estimates or digital values $h_2(x,y)$ are obtained by dividing the digital values $g(x,y)$ by $Threshold(g(x,y))$. Alternatively, the digital values $h_2(x,y)$ are obtained by dividing the digital values $LPF(g(x,y))$ by $LPF[Threshold(g(x,y))]$. In yet another alternative embodiment, the digital values $h_2(x,y)$ are obtained by dividing the digital values $g_o(x,y)$ by $Threshold(g_o(x,y))$. In still another alternative embodiment, the digital values $h_2(x,y)$ are obtained by dividing the digital values $LPF(g_o(x,y))$ by $LPF[Threshold(g_o(x,y))]$. In another embodiment, the digital values $h_2(x,y)$ are obtained by smoothing the mask image $I_{mask}$ at a different level, by obtaining the blended image $I_b$ with the digital values $g(x,y)$, and by dividing $g(x,y)$ by $Threshold(g(x,y))$. In yet another embodiment, the digital values $h_2(x,y)$ are obtained by smoothing the mask image $I_{mask}$ at a different level, by obtaining the blended image $I_b$ with the digital values $g(x,y)$, and by dividing $LPF(g(x,y))$ by $LPF[Threshold(g(x,y))]$. In still another embodiment, the digital values $h_2(x,y)$ are obtained without filtering, such as low pass filtering, $g(x,y)$ or $g_o(x,y)$.

Final inhomogeneity estimates or the digital values $h(x,y)$ of the inhomogeneity image $I_{homogeneity}$ are obtained as follows.

$$h(x,y)=h_1+(h_2-h_1)\theta, \quad (5)$$

where $0<\theta<1$.

In an alternative embodiment, $$h(x,y)=\theta_1 h_1+\theta_2 h_2+ \ldots +\theta_N h_N, \quad (6)$$

where $0<\theta_1, \theta_2, \ldots, \theta_N<1$ and $\theta_1+\theta_2+ \ldots +\theta_N=1$ In the alternative embodiment, $h_i$, where $i=1 \ldots N$, is obtained by using different filters, such as, lowpass, highpass, bandpass, and Gaussian filters, other functions, such as, a shrink function, an average function, a median function, weighted polynomials, a minima function, a maxima function, and any combination of the filters and the functions. For example, $h_i$=[minima of digital values within a neighborhood of $g(x,y)$]/[Threshold(minima of digital values within the neighborhood of $g(x,y)$)]. (7)

As another example, $h_i$=[average of digital values within a neighborhood of $g(x,y)$]/[minima of digital values within the neighborhood of $g(x,y)$]. (8)

As yet another example, $h_i$=Gaussian filter($g(x,y)$)/(minima of digital values within a neighborhood of $g(x,y)$). (9)

As another example, each $h_i$ is obtained using a different LPF. For instance, $h_1$ is obtained using an LPF filtering a first frequency range and $h_2$ is obtained using an LPF filtering a second frequency range. It is noted that to compute $h_i$, any of or any combination of $g_o$, $g_a$, $g_{shrunk}$ and g can be used. It is also noted that to compute the threshold value T, any of or any combination of $g_o$, $g_a$, $g_{shrunk}$ and g can be used. Therefore as used herein $g_m$ refers to any of $g_o$, $g_a$, $g_{shrunk}$ and g.

The digital values f(x,y) of the desired image $I_{desired}$ are obtained 62 as follows.

$$f=[gh]/[hh+\phi], \tag{10}$$

where $\phi>0$, such as, for instance, 1.

It is noted that by choosing a large θ, such as, for example, 0.3, by shrinking $h_i$ by a large amount, and by performing the anisotropic and isotropic smoothing at a high level, high computational efficiency is achieved.

The method includes determining 64 gradient magnitudes of the digital values g(x,y) of the blended image $I_b$ and determining 66 gradient magnitudes of the digital values f(x,y) of the desired image $I_{desired}$. A process of determining gradient magnitudes is described above. Digital values $f_N$ of a normalized image $I_N$ are obtained by computing 68 a normalization factor and normalizing 70 the desired image $I_{desired}$ as follows.

$$f_N=[\{f(\text{grad}(g))\}/\text{grad}(f)]M, \tag{11}$$

where M is a multiplier greater than or equal to 1, such as, for example, 10, [(grad(g))/grad(f)]M is the normalization factor, and grad is a gradient operation that determines gradient magnitudes as described above.

The method includes restricting a ratio $f_N/g$. The ratio is restricted as follows.

If $(f_N/g)>L_K, f_N=gL_K,$ where $L_K$ is an empirically determined factor whose value is greater than or equal to 1, such as, for example, 6. The restriction usually results in an image that does not have large areas of dark regions and large areas of bright regions by compensating for a high level of isotropic and anisotropic smoothing. It is noted that although the methods and systems described herein use 2-dimensional digital values, the methods and systems can use 3-dimensional digital values instead.

Figure 3:
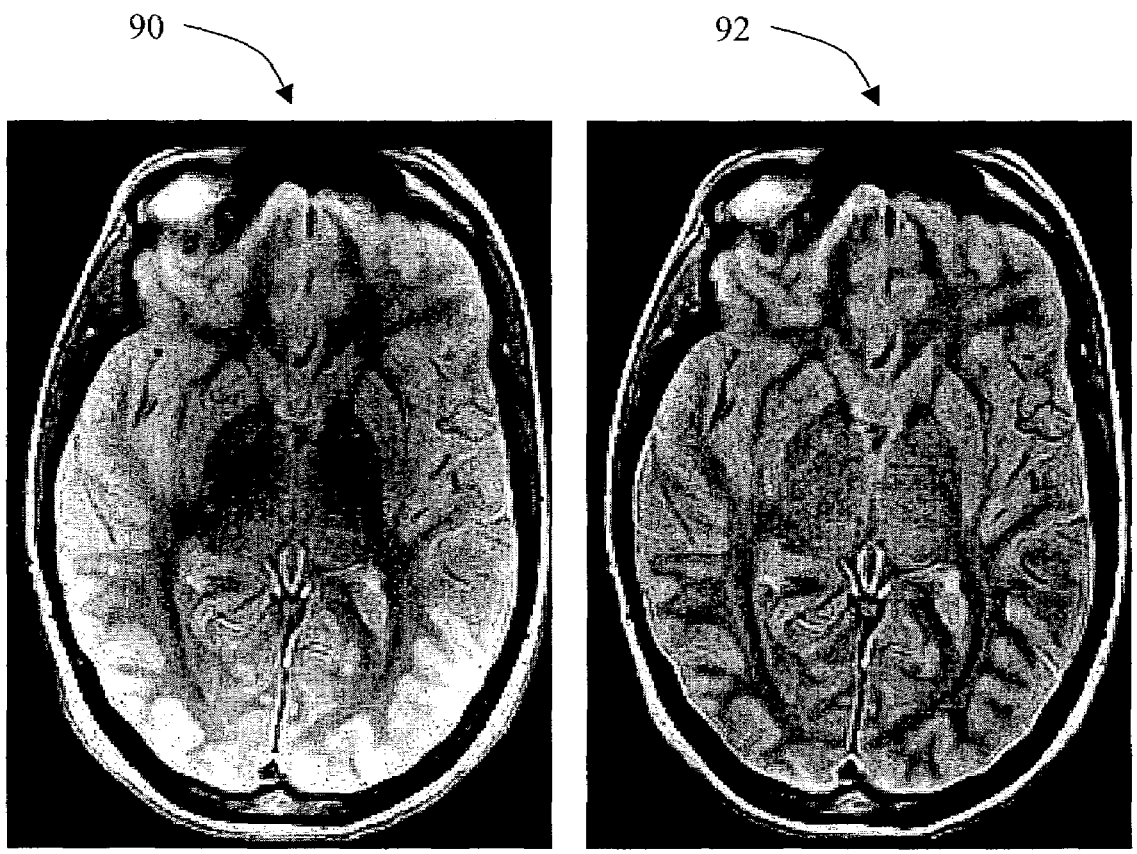
FIG. 3 shows images of a brain of a subject scanned using the MRI system.

FIG. 3 shows images of a brain of subject 16. Image 90 is an example of the blended image $I_b$ having the digital values g(x,y) and image 92 is an example of the image $I_{desired}$, having the digital values f(x,y), obtained after executing the methods for correcting inhomogeneity in images. Image 92 shows lesser inhomogeneities than inhomogeneities present in image 90 and so is an improvement over image 90.

While the invention has been described in terms of various specific embodiments, those skilled in the art will recognize that the invention can be practiced with modification within the spirit and scope of the claims.

What is claimed is:

1. A method for generating an estimate of inhomogeneity, said method comprising:
   acquiring an image;
   generating a threshold value using the acquired image;
   generating a first estimate of inhomogeneity using the acquired image;
   generating a second estimate of inhomogeneity using the acquired image; and
   generating a final estimate of inhomogeneity using h(x, y)=$\theta_1 h_1+\theta_2 h_2+\ldots+\theta_N h_N$, wherein when N=2, the final estimate of inhomogeneity is generated using h=$h_1+(h_2-h_1)*\theta$ wherein h is the final estimate, $h_1$ is the first estimate, $h_2$ is the second estimate, and θ is a scalar such that 0<θ<1.

2. A method in accordance with claim 1 wherein said generating a first estimate comprises generating a first estimate by filtering an image $g_m$, said generating a second estimate comprises generating a second estimate of inhomogeneity using an operation other than filtering on an image $g_m$.

3. A method in accordance with claim 2 wherein said generating a second estimate comprises generating a second estimate of inhomogeneity by dividing $g_m$ by a threshold value of $g_m$ (threshold $g_m$).

4. A method in accordance with claim 3 wherein said generating a second estimate comprises generating a second estimate of inhomogeneity by dividing $g_m$ by threshold $g_m$ where threshold $g_m$ is calculated in accordance with:
   if (SD/BI)<A, then the threshold $g_m$=FI*(BI/FI+B);
   else if (SD/BI)<B, then the threshold $g_m$=FI*(BI/FI+D);
   else if (SD/N)≦C, then the threshold $g_m$=BI;
   else if ((SD/BI)>C) AND (BI/FI)<E, then the threshold $g_m$=FI*G;
   else {
   the threshold $g_m$=FI*(BI/FI−H);
   if the threshold $g_m$<0.0, then the threshold $g_m$=FI*I;
   }
   where FI is foreground intensity computed as an average of structure regions, BI is background intensity computed as an average of non-structure regions having intensity less than FI, SD is a standard deviation of non-structure regions, and A, B, C, D, B, G, H, I are scalars with A<B<C.

5. A method in accordance with claim 4 wherein A is about 0.2, B is about 0.5, C is about 1.0, D is about 0.2, E is about 0.2, G is about 0.2, and H is about 0.1.

6. A method in accordance with claim 2 wherein said generating a first estimate by filtering an image $g_m$ comprises generating a first estimate by filtering an image $g_m$ with a low pass filter.

7. A method in accordance with claim 1 wherein said generating a first estimate comprises generating a first estimate by filtering an image $g_m$ with a first filter, said generating a second estimate comprises generating a second estimate of inhomogeneity by filtering an image $g_m$ with a second filter different than the first filter.

8. A method in accordance with claim 1 wherein said generating a first estimate comprises generating a first estimate by filtering an image $g_m$ with a first low pass filter, said generating a second estimate comprises generating a second estimate of inhomogeneity by filtering an image $g_m$ with a second low pass filter different than the first filter.

9. A method in accordance with claim 1 wherein said generating a first estimate comprises generating a first estimate by filtering an image $g_m$ with a low pass filter, said generating a second estimate comprises generating a second estimate of inhomogeneity by filtering an image $g_m$ with a band pass filter.

10. A method in accordance with claim 1 wherein generating a second estimate comprises generating a second estimate of inhomogeneity by dividing an image $g_m$ by a threshold value of $g_m$ (threshold $g_m$) where threshold $g_m$ is calculated in accordance with:
   if (SD/BI)<0.2, then the threshold $g_m$=FI*(BI/FI+0.2);
   else if (SD/BI)<0.5, then the threshold $g_m$=FI*(BI/FI+0.1);
   else if (SD/BI)≦1.0, then the threshold $g_m$=BI;
   else if ((SD/BI)>1.0) AND (BI/FI)<0.2, then the threshold $g_m$=FI*0.2;
   else {
   threshold $g_m$ FI*(BI/FI−0.1);
   if the threshold $g_m$<0.0, then the threshold $g_m$=FI*0.1;
   } where FI is foreground intensity computed as an average of structure regions, BI is background intensity computed as an average of non-structure regions having intensity less than FI, and SD is a standard deviation of non-structure regions.

11. The computer readable medium in accordance with claim 1 wherein said computer program further configured to instruct the computer to generate the second estimate of inhomogeneity by dividing an image $g_m$ by a threshold value of $g_m$ (threshold $g_m$) where threshold $g_m$ is calculated in accordance with:

if (SD/BI)<0.2, then the threshold $g_m$FI*(BL/FI+0.2);
else if (SD/BI)<0.5, then the threshold $g_m$=FI*(BI/FI+0.1);
else if (SD/BI)≦1.0, then the threshold $g_m$,BI;
else if ((SD/BI)>1.0) AND (BI/FI)<0.2, then the threshold $g_m$=FI*0.2;
else {
the threshold $g_m$FI*(BI/FI−0.1);
if the threshold $g_m$21 0.0, then the threshold $g_m$=FI*0.1;
}
where FI is foreground intensity computed as an average of structure regions, BI is background intensity computed as an average of non-structure regions having intensity less than FI, and SD is a standard deviation of non-structure regions.

12. A magnetic resonance imaging (MRI) system comprising:
a main magnet configured to generate a substantially uniform magnetic field;
a radio frequency pulse generator configured to excite the magnetic field;
a gradient field generator configured to generate gradients extending in different directions in the magnetic field;
a receiver configured to receive magnetic field magnetic resonance (MR) signals representative of an object; and
a computer operationally coupled to said receiver, said computer configured to:
acquire an image;
generate a threshold value using the acquired image;
generate a first estimate of inhomogeneity using the acquired image;
generate a second estimate of inhomogeneity using the acquired image; and
generate a final estimate of inhomogeneity using at least the first and second estimates and the threshold value, using the first and second estimates in accordance with $h=h_1+(h_2-h_1)*\theta$ wherein h is the final estimate, $h_1$ is the first estimate, $h_2$ is the second estimate, and $\theta$ is a scalar such that $0<\theta<1$.

13. A MRI system in accordance with claim 12 wherein said computer further configured to:
generate the first estimate by filtering an image $g_m$; and
generate the second estimate of inhomogeneity using an operation other than filtering.

14. A MRI system in accordance with claim 13 wherein said computer further configured to generate the second estimate of inhomogeneity by dividing an image $g_m$ by a threshold value of $g_m$ (threshold $g_m$).

15. A MRI system in accordance with claim 14 wherein said computer further configured to calculate threshold $g_m$ in accordance with:
if (SD/BI)<0.2, then the threshold $g_m$=FI*(BI/FI+0.2);
else if (SD/BI)<0.5, then the threshold $g_m$=FI*(BI/FI+0.1);
else if (SD/BI)≦1.0, then the threshold $g_m$=BI;
else if ((SD/BI)>1.0) AND (BI/FI)<0.2, then the threshold $g_m$=FI*0.2;
else {
the threshold $g_m$=FI*(BI/FI−0.1);
if the threshold $g_m$<0.0, then the threshold $g_m$=FI*0.1;
}
where FI is foreground intensity computed as an average of structure regions, BI is background intensity computed as an average of non-structure regions having intensity less than FI, and SD is a standard deviation of non-structure regions.

16. A MRI system in accordance with claim 13 wherein said computer further configured to generate the first estimate by filtering an image $g_m$ with a low pass filter.

17. A MRI system in accordance with claim 12 wherein said computer further configured to:
generate the first estimate by filtering an image $g_m$ with a first filter; and
generate the second estimate by filtering an image $g_m$ with a second filter different than the first filter.

18. A MRI system in accordance with claim 12 wherein said computer further configured to:
generate the first estimate by filtering an image $g_m$ with a first low pass filter; and
generate the second estimate by filtering an image $g_m$ with a second low pass filter different than the first low pass filter.

19. A MRI system in accordance with claim 12 wherein said computer further configured to:
generate the first estimate by filtering an image $g_m$ with a low pass filter; and
generating the second estimate by filtering an image $g_m$ with a band pass filter.

20. A MRI system in accordance with claim 12 wherein said computer further configured to:
generate the first estimate by filtering an image $g_m$; and
generating the second estimate of inhomogeneity using an operation other than filtering.

21. A MRI system in accordance with claim 20 wherein said computer further configured to: generate the second estimate of inhomogeneity by dividing an image $g_m$ by a threshold value of $g_m$ (threshold $g_m$) where threshold $g_m$ is calculated in accordance with:
if (SD/BI)<0.2, then the threshold $g_m$=FI*(BI/FI+0.2);
else if (SD/BI)<0.5, then the threshold $g_m$=FI*(BI/FI+0.1);
else if (SD/BI)≦1.0, then the threshold $g_m$=BI;
else if ((SD/BI)>1.0) AND (BI/FI)<0.2, then the threshold $g_m$=FI*0.2;
else {
the threshold $g_m$=FI*(BI/FI−0.1);
if the threshold $g_m$<0.0, then the threshold $g_m$=FI*0.1;
}
where FI is foreground intensity computed as an average of structure regions, BI is background intensity computed as an average of non-structure regions having intensity less than FI, and SD is a standard deviation of non-structure regions.

22. A MRI system in accordance with claim 12 wherein said computer further configured to:
generate the first estimate by filtering an image $g_m$ with a first filter; and
generate the second estimate by filtering an image $g_m$ with a second filter different than the first filter.

23. A computer readable medium encoded with a computer program configured to instruct a computer to:
acquire an image;

generate a threshold value using the acquired image;
generate a first estimate of inhomogeneity using the acquired image;
generate a second estimate of inhomogeneity using the acquired image; and
generate a final estimate of inhomogeneity using at least the first and second estimates and the threshold value, using the first and second estimates in accordance with $h=h_1+(h_2-h_1)*\theta$ wherein h is the final estimate, $h_1$ is the first estimate, $h_2$ is the second estimate, and $\theta$ is a scalar such that $0<\theta<1$.

24. The computer readable medium in accordance with claim 23 wherein said computer program further configured to instruct the computer to:
generate the first estimate by filtering an image $g_m$; and
generate the second estimate of inhomogeneity using an operation other than filtering.

25. The computer readable medium in accordance with claim 23 wherein said computer program further configured to instruct the computer to generate the second estimate of inhomogeneity by dividing an image $g_m$ by a threshold value of $g_m$ (threshold $g_m$) where threshold $g_m$ is calculated in accordance with:
if (SD/BI)<0.2, then the threshold $g_m$=FI*(BI/FI+0.2);
else if (SD/BI)<0.5, then the threshold $g_m$=FI*(BI/FI+0.1);
else if (SD/BI)≦1.0, then the threshold $g_m$=BI;
else if ((SD/BI)>1.0) AND (BI/FI)<0.2, then the threshold $g_m$=FI*0.2;
else {
  the threshold $g_m$=FI*(BI/FI−0.1);
if the threshold $g_m$<0.0, then the threshold $g_m$=FI*0.1;
}
where FI is foreground intensity computed as an average of structure regions, BI is background intensity computed as an average of non-structure regions having intensity less than FI, and SD is a standard deviation of non-structure regions.

26. The computer readable medium in accordance with claim 23 wherein said computer program further configured to instruct the computer to:
generate the first estimate by filtering an image $g_m$ with a first filter; and
generate the second estimate by filtering an image $g_m$ with a second filter different than the first filter.

27. The computer readable medium in accordance with claim 26 wherein said program is configured to instruct the computer to generate the second estimate by filtering an image $g_m$ with a second filter different than the first and wherein the image $g_m$ filtered with the first filter is the same image $g_m$ filtered with the second filter.

28. The computer readable medium in accordance with claim 26 wherein said program is configured to instruct the computer to generate the second estimate by filtering an image $g_m$ with a second filter different than the first and wherein the image $g_m$ filtered with the first filter is an image different then the image $g_m$ filtered with the second filter.

* * * * *